United States Patent [19]

Sriram

[11] Patent Number: 5,043,777
[45] Date of Patent: Aug. 27, 1991

[54] POWER FETS WITH IMPROVED HIGH VOLTAGE PERFORMANCE

[75] Inventor: Saptharishi Sriram, Monroeville, Pa.

[73] Assignee: Westinghouse Electric Corp., Pittsburgh, Pa.

[21] Appl. No.: 593,371

[22] Filed: Sep. 28, 1990

Related U.S. Application Data

[63] Continuation of Ser. No. 389,137, Apr. 3, 1989, abandoned.

[51] Int. Cl.$^5$ .................. H01L 29/80; H01L 29/161; H01L 33/00; H01L 29/20
[52] U.S. Cl. ..................... 357/22; 357/23.2; 357/16; 357/17
[58] Field of Search ...................... 357/22, 22 A, 23.2, 357/16, 17

[56] References Cited

U.S. PATENT DOCUMENTS 4,641,161  2/1987  Kim et al. ......................... 357/23.2
4,916,498  4/1990  Berenz .............................. 357/22 A

OTHER PUBLICATIONS

H. M. Macksey; "GaAs Power FET's Having the Gate Recess Narrower Than the Gate", IEEE Electron Device Letters, vol. EDL-7; No. 2, Feb. 1986, pp. 69-70.
Stephen R. Blight et al., IEEE Transactions on Electronic Devices; vol. ED-33 No. 10, Oct. 1986, pp. 1447-1453.
H. M. Macksey et al., S-band GaAs Power FET with a Semi-Insulating Gate; Inst. Phys. Conf. Ser. No. 65: Chapt. 5 Paper presented at Int. Symp. GaAs and Related Compounds; Albuquerque, 1982, 371-378.
Masashi Ozeki et al., Surface Analysis in GaAs MESFETs by $g_m$ frequency dispersion measurement; Inst. Phys. Conf. Ser. No. 63, Chapt. 7 Paper presented at Int. Symp. GaAs and Related Compounds, Japan, 1981; pp. 323-328.

*Primary Examiner*—Rolf Hille
*Assistant Examiner*—Wael Fahmy
*Attorney, Agent, or Firm*—W. G. Sutcliff

[57] ABSTRACT

An undoped surface layer over and lattice matched to the n-channel layer between the gate contact and the spaced apart source and drain n+ regions in power FETs made of group III-V compounds minimizes surface effects that preclude such devices from operating efficiently at high voltages, and improves reliability. The undoped surface layer may be grown on the n-channel layer before the layer forming the n+ regions, or where the n+ regions can be formed in the undoped surface layer. The invention is especially suitable for GaAs MESFETs and HEMTs.

22 Claims, 3 Drawing Sheets

POWER FETS WITH IMPROVED HIGH VOLTAGE PERFORMANCE

This is a continuation of application Ser. No. 389,137, filed Aug. 3, 1989, now abandoned.

BACKGROUND OF THE INVENTION

1. Field of the Invention

This invention relates to field effect transistors (FETs) and in particular to power FETs of the n-channel type, and especially to those made of group III-V compounds, such as gallium arsenide MESFETs and aluminum gallium arsenide/gallium arsenide HEMTs, having an improved structure which permits them to operate more efficiently at high voltages at RF frequencies.

2. Background Information

An important requirement in many system applications, including phased array radars is a FET device that can operate at large drain bias voltages and deliver radio frequency (RF) power with high gain and good conversion efficiency. A device commonly used for these applications is the metal-semiconductor field effect transistor (MESFET) and typically such devices made of gallium arsenide (GaAs). High gate-drain breakdown voltages can be readily achieved in MESFET structures, even in devices with high doping levels, by carefully controlling the amount of undepleted donor charges in the gate-drain region. However, it has been observed by me that such devices with high breakdown voltages generally exhibit poor RF performance and show premature saturation. A similar observation has been made by others who have noticed that unrecessed or shallow recessed devices yield a higher breakdown voltage but lower output power and efficiency than deeper recessed devices. This behavior was attributed to surface effects, but no explanation of the physical mechanisms involved was given. Other works have also observed premature power saturation in GaAs MESFET devices and attributed it to either bulk or surface effects.

Additional research has shown that deep levels in the buffer layer-active layer interface were responsible for premature power saturation in GaAs MESFETs. This research also showed that for materials grown under proper conditions, the deep level concentrations were very low, and there was no early power saturation. With the advances that have taken place in epitaxial growth techniques, high purity GaAs material can easily be obtained by using molecular beam epitaxy (MBE), metal-organic chemical vapor deposition (MOCVD), or vapor phase epitaxy (VPE). In these materials, the residual defect concentrations are very low and there is high electron mobility. Hence, bulk deep level effects are expected to be small. However, even in such high purity materials, the surface effects could pose a problem. For example, others have correlated power saturation in MESFETs with transconductance dispersion which in turn was related to surface effects. It was explained that the observed dispersion in transconductance arose due to a surface conducting layer which behaved like a high valued resistor. Though the physical origin of this surface layer is not very clear, it is believed to be associated with free arsenic at the surface. The surface mechanism of GaAs has also been believed to be responsible for the degradation of power MESFET performance during reliability tests. Unlike the bulk trapping problem, it is very difficult to solve the surface problem in GaAs since at the present there are no known ways of reliably passivating the surface of GaAs.

Similar surface effect problems are encountered in high electron mobility transistor (HEMTs) made of GaAs and AlGaAs, and it is believed would be present in MESFETs and HEMTs made of other group III-V compounds of the periodic table.

There is a need therefore for FETs which can operate at high voltgates at RF power with good efficiency.

SUMMARY OF THE INVENTION

This need and others are satisfied by the invention which is directed to power FETs which include an undoped layer covering and lattice matched to the n-channel of the FET between source and drain n+ regions which separates the surface charges from the active layers thereby minimizing their influence on the device characteristics. In particular, the invention is directed to a field effect transistor having an n-channel layer grown on a substrate, a pair of n+ regions spaced apart by a portion of the n-channel layer, source and drain contacts fixed to the respective n+ regions, a gate contact contacting the n-channel layer between the spaced apart n+ regions, and an undoped lattice matched surface layer covering the free surface of the n-channel layer at least between the n+ regions. The thickness of the undoped layer is sufficient to substantially transfer the surface resistance effects from the n-channel to the surface of the undoped layer, and to minimize the parasitic surface effect. For such devices wherein the n+ regions are formed such as by ion implantation, the undoped layer only extends across the n-channel surface between the two n+ regions. Where the n+ regions are etched from a layer grown over the n-channel layer, the undoped layer is preferably grown over the entire surface of the n-channel layer and then the n+ layer is grown on top and etched to form the two n+ regions.

The thickness of the undoped layer is sufficient to substantially reduce the surface effect on the n-channel layer. This simultaneously raises the breakdown voltage and reduces the parasitic surface effect. The thickness of the undoped layer can be about 1000 Angstroms to 5000 Angstroms with a thickness of about 2000 Angstroms preferred.

The invention is applicable to FETs made from group III-V compounds, and is particularly suitable for GaAs devices. It is also particularly applicable to HEMTs.

BRIEF DESCRIPTION OF THE DRAWINGS

A full understanding of the invention can be gained from the following description of the preferred embodiments when read in conjunction with the accompanying drawings in which.

DESCRIPTIONS OF THE PREFERRED EMBODIMENTS

Figure 1:
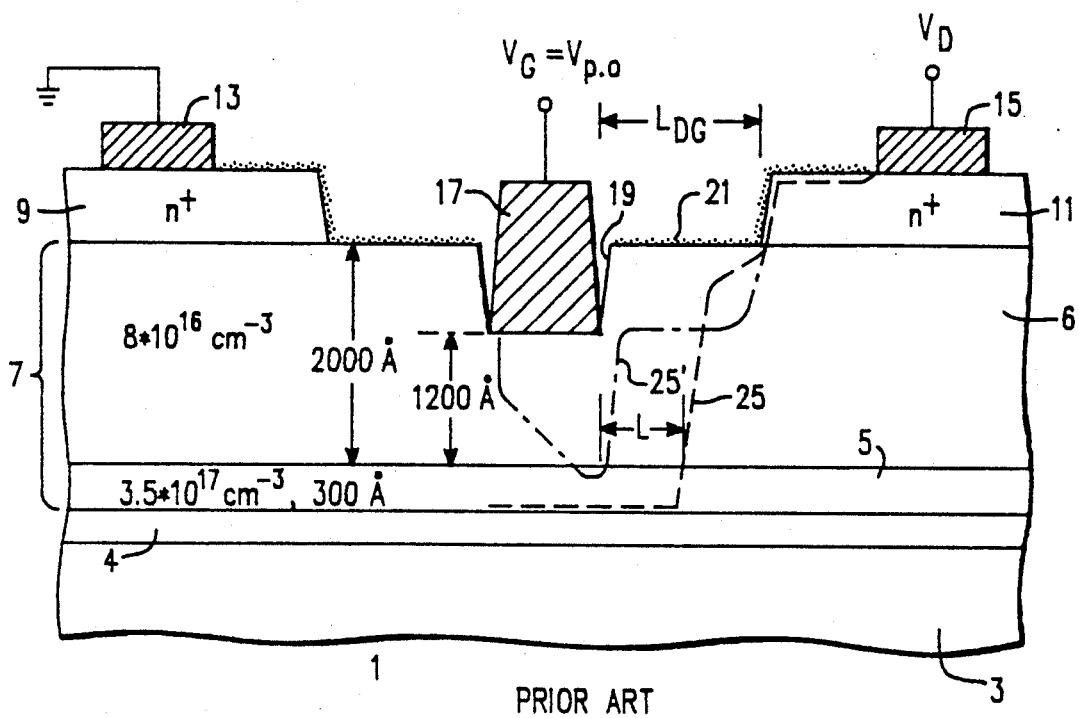
FIG. 1 is a schematic section through a prior art GaAs MESFET illustrating the shape of the depletion region for a large drain voltage under pinch-off conditions and for a small drain voltage under steady state conditions.

To understand the influence of surface conditions on high voltage behavior of MESFETs and HEMTs, and the solution to those problems offered by the invention, consider the prior art MESFET structure shown in FIG. 1. This is a conventional GaAs retrograde material structure but the following discussion applies generally to any such structure.

The MESFET 1 of FIG. 1 includes a substrate 3, with a buffer layer 4, and a 300 angstrom high doped layer 5 and a 2000 angstrom low doped layer 6 forming an n-channel layer 7 on the substrate. A highly doped n+ layer grown on the n-channel layer 7 is etched to form two n+ regions 9 and 11. A source contact 13 is applied to the n+ region 9, while a drain contact 15 is applied to the n+ region 11. A gate contact 17 is formed in a recess 19 in the n-channel layer 7.

In order to explain the surface effects, it is necessary to include a surface resistor 21 which extends along the upper surface of the n-channel 7 and the n+ regions 9 and 11 between the gate contact 17 and the source and drain contacts 13 and 15 respectively. The sheet resistance of this layer is usually in the range of $10^9$–$10^{12}$ ohms/square, dependent upon the various device processing steps involved. This surface resistance can lead to high power saturation in high voltage MESFETs and HEMTs. Due to the surface resistance, the surface potential in the gate-drain and gate-source regions will vary linearly with distance. This is in contrast to the conventional view where the surface potential is assumed to be constant at approximately 0.6 V regardless of the bias conditions. Due to the linear variation, the surface potential $V_s$, at any point in the gate-drain region can be written as follows:

$$V_s(x) = \frac{V_D - V_G}{L_{DG}} x + V_G - 0.6 \text{ volts} \qquad \text{Eq. 1}$$

Where $V_D$ equals the drain voltage
$V_G$ equals gate voltage
$L_{DG}$ equals the length of the exposed surface of the n-channel layer 7 between the gate and the n+ region 11
0.6 V equals the built-in surface potential Due to the above linear potential variation, when gate voltage $V_g$ equals $V_{p.o.}$ (pinch-off voltage) and the drain voltage is $V_D$ (a typical class B quiescent bias condition), the shape of the depletion region in the gate-drain region will be as shown by depletion region edge 25 in FIG. 1. The extent of the region, L, where the device is completely depleted, can be easily shown to be:

$$L = L_{DG} \left[ \frac{V_D + V_{p.02} - V_{p.01} + 0.6}{V_D - V_{p.01}} \right] \qquad \text{Eq. 2}$$

Where $V_{p.01}$ is the pinch-off voltage under the gate and
$V_{p.02}$ is the pinch-off voltage across the full n-channel.

For the structure shown in FIG. 1, $V_{p.01}$ equals $-2$ V, $V_{p.02}$ equals $-5.5$ V, and with $L_{DG}$ equal to 4 μm, and $V_d$ equals 10 V:

$$L = \frac{7.1}{12} \times 4\mu m = 2.37 \mu m \qquad \text{Eq. 3}$$

Consider now what happens when the gate voltage is reduced to zero volts, as occurs during RF swing. Under steady state conditions for this bias and for low drain voltage, the depletion region, defined by the depletion region edge will be as shown by the dash dot line 25' in FIG. 1. However, during the short time of an RF swing, the device cannot completely relax from the condition shown by the line 25' to that shown by the line 25, since this relaxation involves discharge of additional charges through high value surface resistance. Thus, under zero gate bias condition, during the RF swing, an additional drain voltage will have to appear across the depleted region. This additional drop will also reduce the drain current that can flow for a given applied voltage. It is this reduction of drain current and voltage swings which reduces the output power and efficiency as normally observed experimentally.

From the above discussion, it appears evident that the length of the region L should be minimized in order to reduce surface problems. From equation 2, it is clear that L can be reduced by reducing $L_{DG}$. This approach is very useful, but has the following limitations. $L_{DG}$ cannot be reduced arbitrarily without sacrificing the gate-drain breakdown voltage. For very small spacings, the breakdown voltage will be limited by punch through between the gate and drain. Another drawback of this approach is that the drain-gate feedback capacitance will also be increased for small spacing, and this will limit the RF gain. In practice, $L_{DG}$ equal 0.5 to pb 1.0μm appears to be a reasonable compromise. It can also be seen from equation 2 that further reduction in L can be obtained by increasing the magnitude of $V_{p.02}$. An obvious way to increase the magnitude of $V_{p.02}$ is to increase the depth of the recess for a given thickness under the gate. However, such a technique has a drawback that the number of undepleted charges in the gate-drain region will be increased and this will lead to a lower breakdown voltage. It will also increase the feedback capacitance and thus reduce RF gain.

Figure 2:
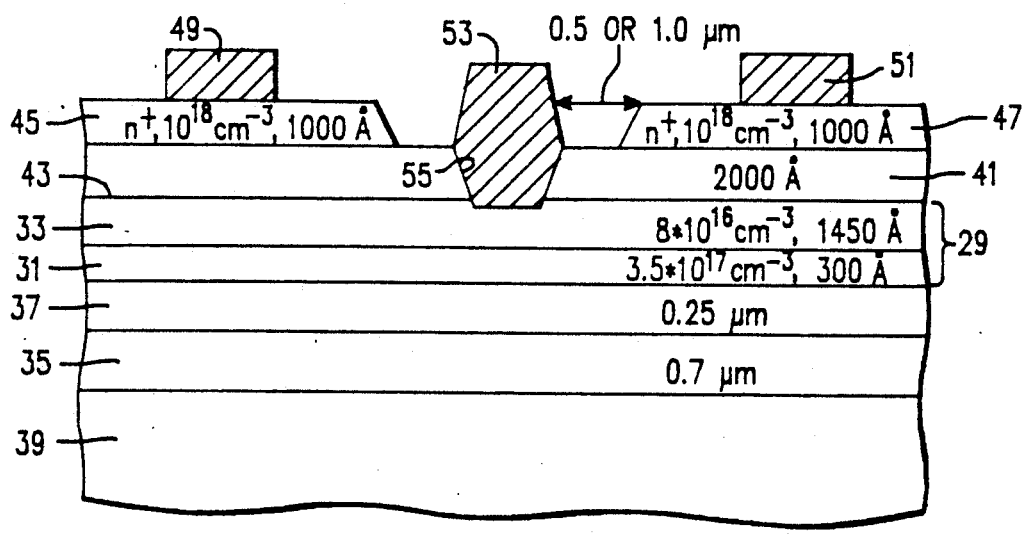
FIG. 2 is a schematic section through a MESFET in accordance with the teachings of the invention.

FIG. 2 illustrates the invention as applied to a GaAs MESFET. For the sake of discussion, the MESFET 27 is shown in a retrograde profile. This retrograde device has an n-channel 29 comprising a more highly doped 300 angstrom layer 31 below a 1450 angstrom doped layer 33. A super lattice layer 35 and an undoped layer 37 form buffer layers between the substrate 39 and the n-channel 29 as is conventional. Other forms of buffer layers can be used in the alternative. In accordance with the invention, an undoped layer 41 is grown over the free surface 43 of the n-channel 29 below a heavily doped n+ layer which forms the n+ regions 45 and 47. Source and drain contacts 49 and 51 are affixed to the n+ regions 45 and 47 respectively. A gate 53 is formed in a recess 55 etched through the undoped layer 41 and into the n-channel 29. In the exemplary device, the undoped layer 41 is 2000 angstroms thick. As used herein, the undoped layer has not more than about $10^{16}$ cm$^{-3}$ impurities, with about $10^{14}$ cm$^{-3}$ to $10^{15}$ cm$^{-3}$ being typical. This undoped layer is lattice matched to the n-channel layer. Thus, in the exemplary GaAs MESFET, the undoped lattice matched surface layer 41 is GaAs. A superlattice material such as AlGaAs could also be used for the undoped layer, the essential features being that it is undoped and is lattice matched to the n-channel 29. This undoped lattice matched surface layer 41 separates the surface charges from the MESFET active layers, thus minimizing their influence on device characteristics. It is important to note that such a separation in this new structure is achieved without introducing any additional donor charges into the gate-drain region, since the presence of excess donor charges in this region would lower the device drain-gate breakdown voltage. For a given application, the thickness of the undoped layer can be chosen to yield high breakdown voltage as well as minimize the parasitic surface effect. The new structure will also improve the reliability of the gallium arsenide power MESFETs by minimizing the parasitic effects of surface degradation that occur during aging.

The undoped layer 41 over the surface 43 of the n-channel 29 in the device of FIG. 2 increases the pinch-off voltage in the gate-drain region without producing any additional amount of undepleted charge compared to the structure shown in FIG. 1. For example, $V_{p.02}$ for the structure in FIG. 2 is $-9.8$ volts compared to $-5.5$ volts the device of FIG. 1. $V_{p.02}$ can be even further increased by increasing the thickness of the undoped layer further to about 5000 angstroms. An effective reduction in surface effects can be achieved down to a thickness of about 1000 angstroms for the undoped layer 41.

Figure 3:
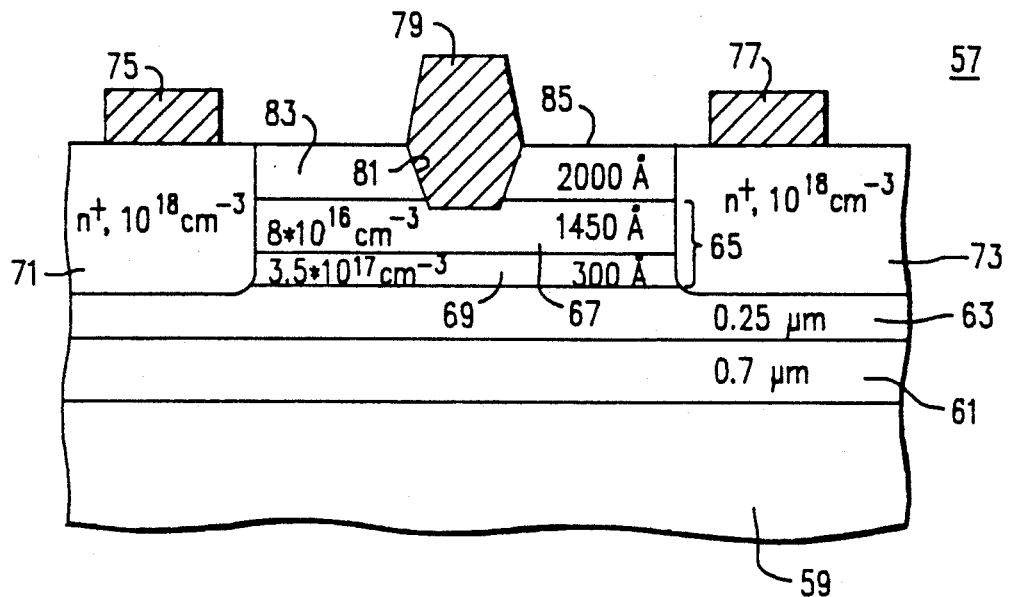
FIG. 3 is a schematic section through another embodiment of a MESFET incorporating the invention.

Another embodiment of the invention is illustrated in FIG. 3. This device 57 is also a MESFET with a retrograde structure and includes a substrate 59, a superlattice layer 61 and an undoped layer 63 forming a buffer, and an n-channel 65 comprising a low doped layer 67 over a high doped layer 69. The difference in this device 57 is that the n+ regions 71 and 73 are not part of a separately grown n+ layer, but are formed in previously applied layers, such as by ion implantation or other known techniques. A source contact 75 is then affixed to the n+ region 71 while a drain contact 77 is provided for the n+ region 73. A gate 79 is provided in a recess 81 in the low doped layer 67 of the n-channel 65. Such a MESFET device is known, and is subject to the same surface effects as the device in FIG. 1. Therefore, in accordance with the invention, an undoped surface layer 83 is grown over the n-channel 65 and the n+ regions 71 and 73 are formed in this undoped layer such as by ion implantation. As in the case of the device of FIG. 2, the addition of the undoped surface layer 83 lattice matched to the n-channel increases the distance between the substrate 59 and the outer surface 85 of the device between the source and drain to thereby increase the pinch-off voltage while decreasing the carrier density which improves the high voltage performance of the MESFET. Again, the undoped surface layer 83 is between about 1000 and 5000 angstroms in thickness with a preferred thickness of about 2000 angstroms.

Figure 4:
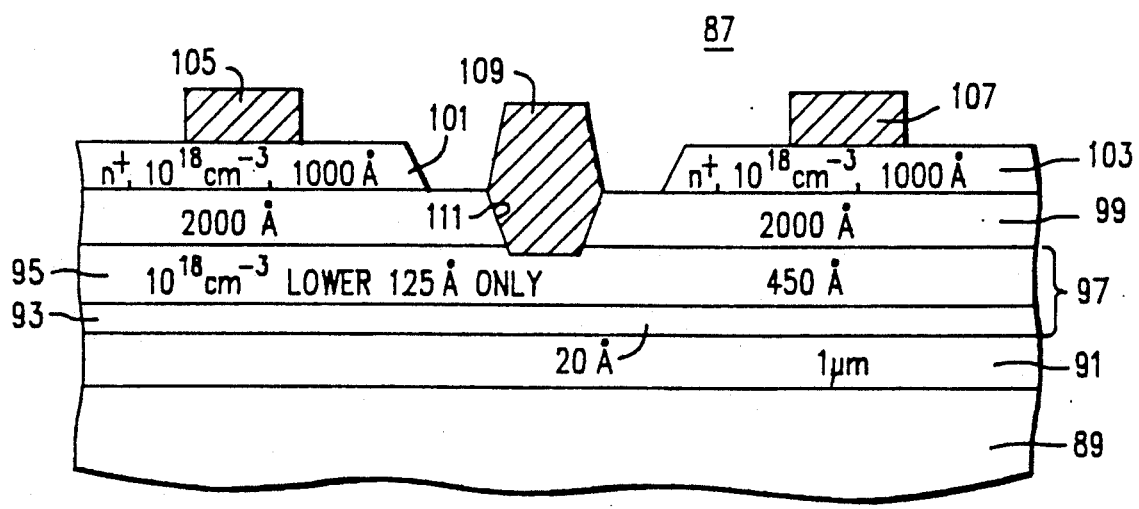
FIG. 4 is a schematic section through an HEMT incorporating the invention.

FIG. 4 illustrates a high electron mobility transistor (HEMT) incorporating the invention. This known type of device includes a GaAs substrate 89, an undoped GaAs layer 91, an undoped AlGaAs spacer layer 93 and a second AlGaAs layer 95 which is highly doped only adjacent the spacer layer forming an n-channel 97, an undoped GaAs surface layer 99, and spaced apart n+ regions 101 and 103 etched from a layer grown on the undoped surface layer 99. As with the MESFET, the HEMT 87 has a source contact 105 on the n+ region 101 and a drain contact 107 on the n+ region 103. A gate 109 is formed in a recess 111 which extends through the undoped surface layer 99 into the AlGaAs layer 95 of the n-channel 97. The undoped lattice matched surface layer 99 also increases the pinch-off voltage of the HEMT device 87 without adding carriers to thereby improve the high voltage performance of the device.

The surface effects which the invention minimizes, are believed to be common to MESFETs and HEMTs composed of compounds made of elements from groups III–V of the periodic table. The inclusion of the undoped lattice matched surface layer of the invention should improve the high voltage characteristics of devices made from these compoumds. While GaAs is the most commonly used group III–V compound, other compounds in this group include, for example, gallium indium arsenide and indium phosphide.

Figure 5A:
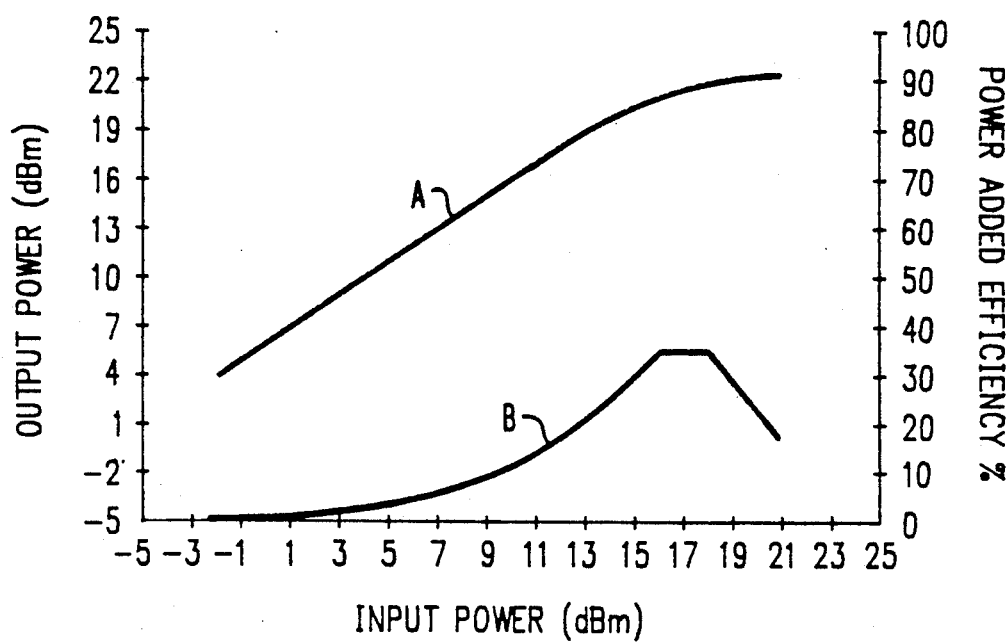
FIGS. 5a and 5b are plots illustrating the performance of the MESFET of FIG. 2 at drain-source voltages of five volts and ten volts respectively.
Figure 5B:
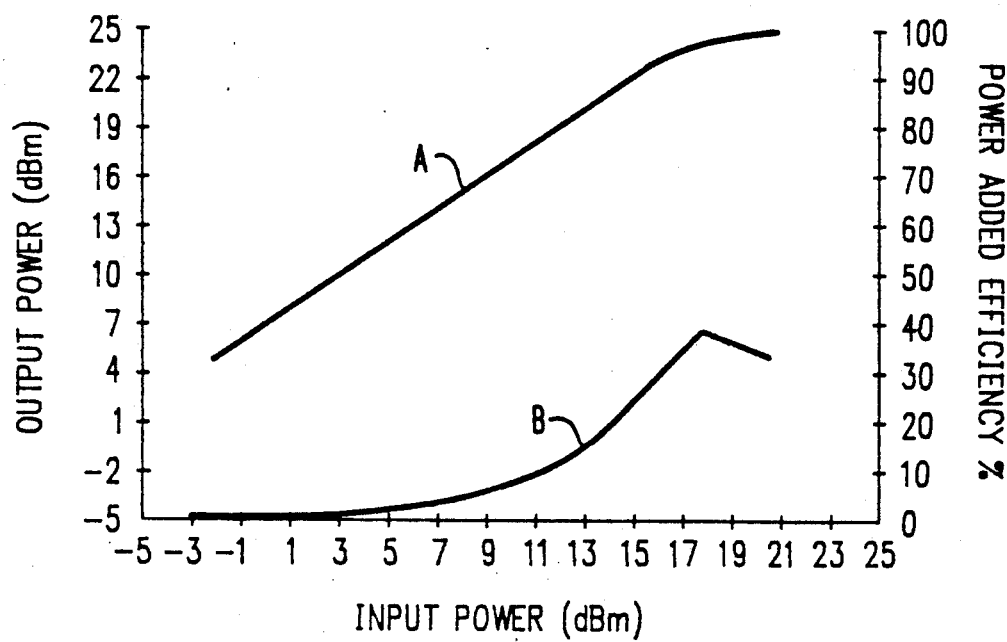

The MESFET 27 shown in FIG. 2 has been fabricated and tested at 10 GHz with excellent results. The devices had breakdown voltages greater than 25 V. Examples of the RF power performance at drain-source voltages of five volts and ten volts are shown in FIGS. 5a and 5b respectively. The output power is illustrated by the trace A in these figures and the power added efficiency by the trace B. Output power of approximately 420 m watts/mm at an efficiency of 39% was achieved.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A field effect transistor comprising:
  a substrate;
  an n-channel layer on said substrate;
  a pair of n+ regions spaced apart by a portion of said n-channel layer;
  a source contact affixed to one of said n+ regions;
  a drain contact affixed to the other n+ region;
  an undoped surface layer covering said n-channel layer at least between said n+ regions, said undoped layer being lattice matched to the n-channel layer and having a thickness of at least about 1000 angstroms to substantially reduce surface resistivity effects of said n-channel layer; and
  a gate contact extending through said undoped surface layer and contacting said n-channel layer between the spaced apart n+ regions.

2. The field effect transistor of claim 1 wherein said substrate, n-channel layer, n+ regions, and undoped surface layer all consist essentially of group III–V compounds.

3. The field effect transistor of claim 2 wherein said undoped surface layer is grown on and is substantially coextensive with said n-channel layer except at said gate contact, and wherein said spaced apart n+ regions are grown on said undoped layer.

4. The field effect transistor of claim 3 wherein said undoped surface layer is about 1000 to 5000 angstroms thick.

5. The field effect transistor of claim 4 wherein said undoped surface layer is about 2000 angstrom thick.

6. The field effect transistor of claim 2 wherein said undoped surface layer is grown over the n-channel layer and said spaced apart n+ regions are formed in said undoped layer.

7. The field effect transistor of claim 6 wherein said undoped surface layer is about 1000 to 5000 angstroms thick.

8. The field effect transistor of claim 7 wherein said undoped surface layer is about 2000 angstroms thick.

9. The field effect transistor of claim 2 wherein said field effect transistor is a MESFET.

10. The field effect transistor of claim 9 wherein said group III-V comopound is GaAs.

11. The field effect transistor of claim 10 wherein said undoped surface layer is about 1000 to 5000 angstroms thick.

12. The field effect transistor of claim 11 wherein said undoped surface layer is about 2000 angstroms thick.

13. The field effect transistor of claim 11 wherein said undoped surface layer is grown on and is substantially coextensive with said free surface of said n-channel layer except at said gate contact, and wherein said spaced apart n+ regions are grown on said undoped surface layer.

14. The field effect transistor of claim 11 wherein said undoped surface layer is grown over the n-channel layer and said spaced apart n+ regions are formed in said undoped layer.

15. The field effect transistor of claim 2 wherein said field effect transistor is a high mobility electron transistor.

16. The field effect transistor of claim 15 wherein said undoped surface layer is about 1000 to 5000 angstroms thick.

17. The field effect transistor of claim 16 wherein said undoped surface layer is about 2000 angstroms thick.

18. The field effect transistor of claim 15 wherein said substrate, n-channel layer, n+ regions, and undoped surface layer all consist essentially of group III-V compounds.

19. The field effect transistor of claim 18 wherein said group III-V compounds for said n+ regions said substrate and said undoped surface layer comprise GaAs and wherein said n-channel includes an undoped GaAs layer, a doped GaAs layer and an aluminum gallium arsenide layer.

20. A field effect transistor comprising:
a substrate;
a GaAs n-channel layer on said substrate;
a pair of n+ regions spaced apart by a portion of said n-channel layer;
a source contact affixed to one of said n+ regions;
a drain contact affixed to the other n+ region;
an undoped GaAs surface layer covering said n-channel layer at least between said n+ regions, said undoped layer having a thickness of at least about 1000 angstroms to substantially reduce surface resistivity effects of said n-channel layer; and
a gate contact extending through said undoped surface layer and contacting said n-channel layer between the spaced apart n+ regions.

21. The field effect transistor of claim 20 wherein said undoped GaAs surface layer is about 1000 to 5000 Å thick.

22. The field effect transistor of claim 3 wherein said undoped GaAs layer is about 200 Å thick.

* * * * *